(12) United States Patent
Sasaki et al.

(10) Patent No.: US 7,129,994 B2
(45) Date of Patent: Oct. 31, 2006

(54) TELEVISION TUNER HAVING LEVEL OF HARMONICS OF OSCILLATION SIGNAL SUPPRESSED LOW

(75) Inventors: Michinori Sasaki, Fukushima-ken (JP); Hiroyuki Sawamoto, Fukushima-ken (JP)

(73) Assignee: Alps Electric Co., Ltd., Tokyo (JP)

( * ) Notice: Subject to any disclaimer, the term of this patent is extended or adjusted under 35 U.S.C. 154(b) by 512 days.

(21) Appl. No.: 10/655,155

(22) Filed: Sep. 4, 2003

(65) Prior Publication Data
US 2004/0046898 A1    Mar. 11, 2004

(30) Foreign Application Priority Data
Sep. 11, 2002    (JP)    ............ 2002-005771 U

(51) Int. Cl.
| | |
|---|---|
| H04N 5/44 | (2006.01) |
| H04N 5/62 | (2006.01) |
| H04N 5/63 | (2006.01) |
| H04N 7/18 | (2006.01) |
| H04N 9/47 | (2006.01) |
| H04B 1/10 | (2006.01) |
| H04B 15/06 | (2006.01) |
| H05K 1/18 | (2006.01) |
| H03J 1/00 | (2006.01) |
| H03J 3/00 | (2006.01) |
| H03J 5/00 | (2006.01) |

(52) U.S. Cl. .................. 348/731; 348/87; 348/607; 348/725; 348/730; 348/733; 455/300; 455/301; 455/310; 455/311; 455/317; 455/333; 361/764; 334/85

(58) Field of Classification Search .............. 348/87, 348/607, 725, 731, 735–737; 455/300, 301, 455/310, 311, 317–319, 333; 361/764; 334/85
See application file for complete search history.

(56) References Cited

U.S. PATENT DOCUMENTS

| 4,352,209 | A | | 9/1982 | Ma |
| 5,710,999 | A | * | 1/1998 | Iwase et al. ................. 455/349 |
| 5,737,035 | A | * | 4/1998 | Rotzoll ....................... 348/725 |
| 6,177,964 | B1 | * | 1/2001 | Birleson et al. ............ 348/725 |
| 6,400,416 | B1 | * | 6/2002 | Tomasz ...................... 348/654 |
| 6,944,431 | B1 | * | 9/2005 | Suzuki et al. ............ 455/188.2 |

(Continued)

FOREIGN PATENT DOCUMENTS

EP    0 909 019 A2    4/1999

(Continued)

*Primary Examiner*—Brian P. Yenke
(74) *Attorney, Agent, or Firm*—Brinks Hofer Gilson & Lione

(57) ABSTRACT

The level of the harmonics of oscillation signals for synchronous detection to be inputted to a mixer circuit for converting frequencies is suppressed low. A first integrated circuit component formed with a first mixer circuit for converting frequencies; a second integrated circuit component formed with a second mixer circuit for synchronously detecting intermediate frequency signals and an oscillator transistor circuit; a resonant circuit coupled to the oscillator transistor circuit and forming an oscillator circuit for synchronous detection; an intermediate frequency tuning circuit interposed between the first mixer circuit and the second mixer circuit; and a circuit board for mounting the first integrated circuit component, the second integrated circuit component the intermediate frequency tuning circuit and the resonant circuit in a predetermined block area are provided, wherein the resonant circuit is mounted on the side opposite to the side where the first integrated circuit component and the intermediate frequency tuning circuit are mounted as the second integrated circuit component is sandwiched.

1 Claim, 4 Drawing Sheets

U.S. PATENT DOCUMENTS

| | | | |
|---|---|---|---|
| 6,963,620 B1* | 11/2005 | Lee et al. | 375/295 |
| 2002/0047942 A1* | 4/2002 | Vorenkamp et al. | 348/731 |
| 2003/0137607 A1* | 7/2003 | Kovacic et al. | 348/731 |
| 2004/0004674 A1* | 1/2004 | Birleson | 348/731 |

FOREIGN PATENT DOCUMENTS

| | | |
|---|---|---|
| EP | 0 932 252 A2 | 7/1999 |
| JP | 11-122133 | 4/1999 |

* cited by examiner

TELEVISION TUNER HAVING LEVEL OF HARMONICS OF OSCILLATION SIGNAL SUPPRESSED LOW

BACKGROUND OF THE INVENTION

1. Field of the Invention

The present invention relates to a television tuner, particularly to a television tuner in which mutual interference is reduced between circuits to be mounted on a circuit board.

2. Description of the Related Art

In regard to a traditional television tuner, the layout of circuit components to be mounted on a circuit board is shown in FIG. 3. FIG. 3 is a plan view illustrating the inside of a television tuner, depicting a circuit board 32 mounted in a rectangular frame 31 and the layout of circuits disposed on the circuit board 32. The frame 31 is formed of a first side plate 31a bent in a horseshoe shape and a second side plate 31b for connecting two sides facing each other in the first side plate 31a in which the circuit board 32 is mounted in the rectangular area surrounded by the two side plates 31a and 31b. Then, a connector 33 for taking in television signals is mounted on the first side plate 31a, and a plurality of terminals 34 to be connected to the circuit board 32 is mounted on the second side plate 31b.

The circuit board 32 is separated into three block areas 32a, 32b and 32c as shown in the drawing, and shield plates, not shown, are erected along the borders (indicated by dotted lines) between the block areas adjacent to each other. Then, an input tuning circuit (not shown) is formed in the first block area 32a disposed on the connector 33 side, and a high frequency amplifier circuit and an interstage tuning circuit (both not shown) are formed in the second block area 32b disposed inbetween. In addition, an intermediate frequency circuit for converting the inputted television signals to intermediate frequency signals and for detecting intermediate frequency signals is formed in the third block area 32c most separated from the connector 33.

The intermediate frequency circuit has the configuration as shown in FIG. 4, and a first oscillation signal is fed from a first oscillator circuit 42 to a first mixer circuit 41 for converting frequencies. The first oscillator circuit 42 is formed of a first oscillator transistor circuit 42a and a first resonant circuit 42b coupled thereto. Then, the first mixer circuit 41 and the first oscillator transistor circuit 42a are formed in a first integrated circuit component 40. An intermediate frequency tuning circuit 43 is connected to the subsequent stage of the first mixer circuit 41, and an intermediate frequency amplifier circuit 44 is connected to the subsequent stage of the intermediate frequency tuning circuit 43. The intermediate frequency amplifier circuit 44 is also formed in the first integrated circuit component 40. A SAW filter 45 is connected to the subsequent stage of the intermediate frequency amplifier circuit 44.

A second mixer circuit 47 for synchronous detection is connected to the subsequent stage of the SAW filter 45. A second oscillation signal is fed to the second mixer circuit 47 from a second oscillator circuit 48. The second oscillator circuit is formed of a second oscillator transistor circuit 48a and a second resonant circuit 48b connected thereto. Among them, the second oscillator transistor circuit 48a is formed in a second integrated circuit component 46 along with the second mixer circuit 47.

And, when a television signal to be received is inputted to the first mixer circuit 41, it is mixed with the first oscillation signal outputted from the first oscillator circuit 42 and converted to an intermediate frequency signal. The intermediate frequency signal is inputted to the second mixer circuit 47 through the intermediate frequency tuning circuit 43, the intermediate frequency amplifier circuit 44 and the SAW filter 45. Then, it is mixed with a second oscillation signal (the same frequency as a video intermediate frequency in an intermediate frequency band) outputted from the second oscillator circuit 48 and is synchronously detected to obtain a video signal.

Next, the detailed layout of the intermediate frequency circuit formed in the third block area 32c will be described. The third block area 32c has a nearly square shape, and the first integrated circuit component 40 and the second integrated circuit component 46 are disposed in small areas diagonally splitting the square area. Additionally, the first resonant circuit 42b is formed adjacent to the first integrated circuit component 40, and the second resonant circuit 48b is formed adjacent to the second integrated circuit component 46. Furthermore, the intermediate frequency tuning circuit 43 is formed in the area between the area formed with the first integrated circuit component 40 and the area formed with the second resonant circuit 48b, and the SAW filter 45 is formed in the area between the area formed with the second integrated circuit component 46 and the area formed with the first resonant circuit 42b. The first resonant circuit 42b, the second resonant circuit 48b and the intermediate frequency tuning circuit 44 are formed of components such as coils and condensers, and these components are mounted on the circuit board 32.

Power source voltage is fed to the first integrated circuit component 40 and the second integrated circuit component 46 by a power supply line 49 made of a conductor formed on the circuit board 32. A terminal 34a applied with the power source voltage is disposed at the position corresponding to the second block area 32b. On this account, a common power supply line 49a connected to a terminal 34a is disposed from the second block area 32b to the third block area 32c, and is connected to two power supply lines 49b and 49c in the third block area 32c. The power supply line 49b, one of them, is disposed between the area formed with the intermediate frequency tuning circuit 43 and the area formed with the second resonant circuit 48b, and the power supply line 49c, the other of them, is disposed in the area opposite to the power supply line 49b as the second resonant circuit 48b is sandwiched. Then, current is fed to the first integrated circuit component 40 through the power supply line 49b, one of them, and is fed to the second integrated circuit component 46 through the power supply line 49c, the other of them.

SUMMARY OF THE INVENTION

In the configuration, when a television tuner is based on US specifications, the second oscillation signal outputted from the second oscillator circuit 48 is 45.75 MHz. Naturally, its harmonics are also outputted. These harmonics are emitted from the second resonant circuit 48b, and they jump to the intermediate frequency tuning circuit 43 through the power supply lines 49b and 49c, or jump to the intermediate frequency tuning circuit 43 directly. The harmonics jumped to the intermediate frequency tuning circuit 43 are further inputted to the first mixer circuit in the first integrated circuit component.

In the meantime, the first oscillation signal outputted from the first oscillator circuit 42 is 137 MHz in receiving Channel (A-5) of CATV, 179 MHz in receiving Channel (c), and 227 MHz in receiving Channel (8). On the other hand, a second harmonic of the second oscillation signal is 91.5 MHz, a third harmonic is 137.25 MHz, and a fourth harmonic is 183.0 MHz. Therefore, in receiving each channel, the first oscillation signal and the harmonics are mixed in the first mixer circuit 41, and the first mixer circuit generates a signal having a frequency of the difference between them. However, the frequency enters the intermediate frequency band, thus causing interference.

Accordingly, an object of the invention is to reduce electric coupling of a resonant circuit forming an oscillator circuit for synchronous detection to a power supply line and an intermediate frequency tuning circuit and to suppress the level of the harmonics of an oscillation signal for synchronous detection to be inputted to a mixer circuit for converting frequencies low.

As a means for the purpose, in the invention, a first integrated circuit component formed with a first mixer circuit for converting a television signal to an intermediate frequency signal;

a second integrated circuit component formed with a second mixer circuit for synchronously detecting the intermediate frequency signal and an oscillator transistor circuit;

a resonant circuit coupled to the oscillator transistor circuit and forming an oscillator circuit for synchronous detection; an intermediate frequency tuning circuit interposed between the first mixer circuit and the second mixer circuit; and a circuit board for mounting the first integrated circuit component, the second integrated circuit component, the intermediate frequency tuning circuit and the resonant circuit in a predetermined block area, wherein the resonant circuit is mounted on a side opposite to a side where the first integrated circuit component and the intermediate frequency tuning circuit are mounted as the second integrated circuit component is sandwiched.

In addition, a power supply line for feeding power source voltage to the first integrated circuit component and the second integrated circuit component is disposed in the block area, and the power supply line is disposed between the first integrated circuit component and intermediate frequency tuning circuit and the second integrated circuit component.

Furthermore, the power supply line is formed of a first power supply line for feeding the power source voltage to the first integrated circuit component and a second power supply line for feeding the power source voltage to the second integrated circuit component, and the first power supply line and the second power supply line are formed separately in the block area without being connected to each other.

As described above, in the invention, the resonant circuit forming the oscillator circuit for synchronous detection is mounted in the area opposite to the side where the first integrated circuit component forming the first mixer circuit for converting frequencies and the intermediate frequency tuning circuit are mounted as the second integrated circuit component is sandwiched. Therefore, even when the harmonics are emitted from the resonant circuit, they are hard to jump to the mixer circuit and the intermediate frequency tuning circuit. Accordingly, the level of interfering signals generated in the first mixer circuit due to the harmonics is lowered.

Additionally, the power supply line for feeding power source voltage to the first integrated circuit component and the second integrated circuit component is disposed in the block area, and the power supply line is disposed between the first integrated circuit component and intermediate frequency tuning circuit and the second integrated circuit component. Thus, the position to mount the resonant circuit is separated from the power supply line as well, further exerting advantages.

Furthermore, the power supply line is formed of the first power supply line for feeding power source voltage to the first integrated circuit component and the second power supply line for feeding power source voltage to the second integrated circuit component, and the first power supply line and the second power supply line are formed separately without being connected to each other in the block areas. Therefore, the coupling between the two power supply lines decrease as well, and the harmonics jumped to the resonant circuit close to the second power supply line are hard to jump to the first power supply line. Consequently, a jump to the intermediate frequency tuning circuit is reduced.

BRIEF DESCRIPTION OF THE DRAWINGS

The teachings of the invention can be readily understood by considering the following detailed description in conjunction with the accompanying drawings, in which.

DESCRIPTION OF THE PREFERRED EMBODIMENT

Figure 1:
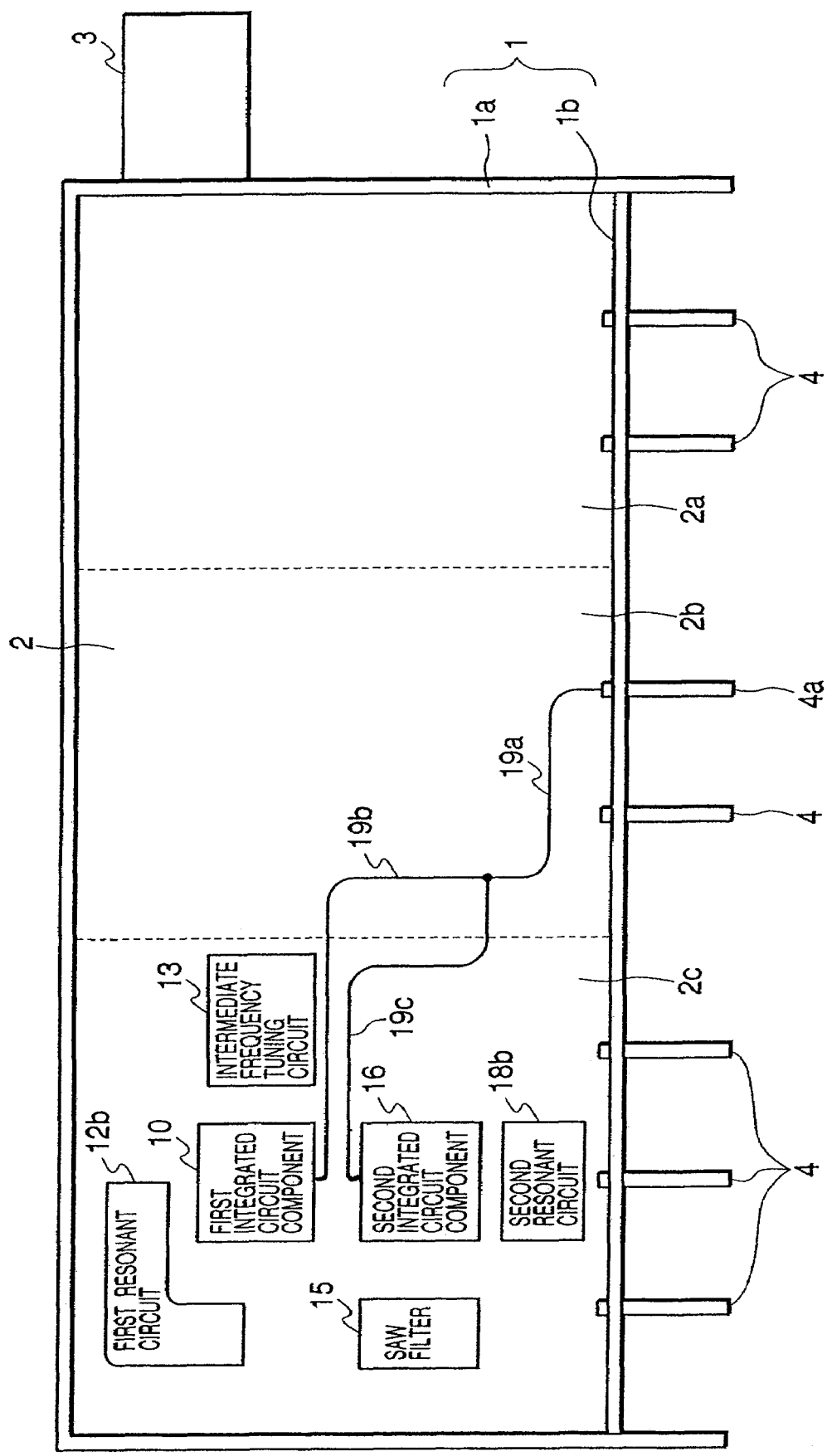
FIG. 1 is a layout diagram illustrating a television tuner according to the invention.

The layout of circuits in a television tuner according to the invention is shown in FIG. 1. FIG. 1 depicts the layout of a circuit board 2 mounted on a rectangular frame 1 and the circuits disposed on the circuit board 2. A frame 1 is formed of a first side plate 1a bent in a horseshoe shape and a second side plate 1b for connecting two sides facing each other in the first side plate 1a in which the circuit board 2 is mounted in the rectangular area surrounded by the two side plates 1a and 1b. Then, a connector 3 for inputting television signals is mounted on the first side plate 1a, and a plurality of terminals 4 to be connected to the circuit board 2 is mounted on the second side plate 1b.

The circuit board 2 is separated into three block areas 2a, 2b and 2c as shown in the drawing, and shield plates, not shown, are erected along the borders (indicated by dotted lines) between the block areas adjacent to each other. Then, an input tuning circuit (not shown) is formed in the first block area 2a disposed on the connector 3 side, and a high frequency amplifier circuit and an interstage tuning circuit (both not shown) are formed in the second block area 2b disposed in between. In addition, an intermediate frequency circuit for converting the inputted television signals to intermediate frequency signals and for detecting intermediate frequency signals is formed in the third block area 2c most separated from the connector 3.

Figure 2:
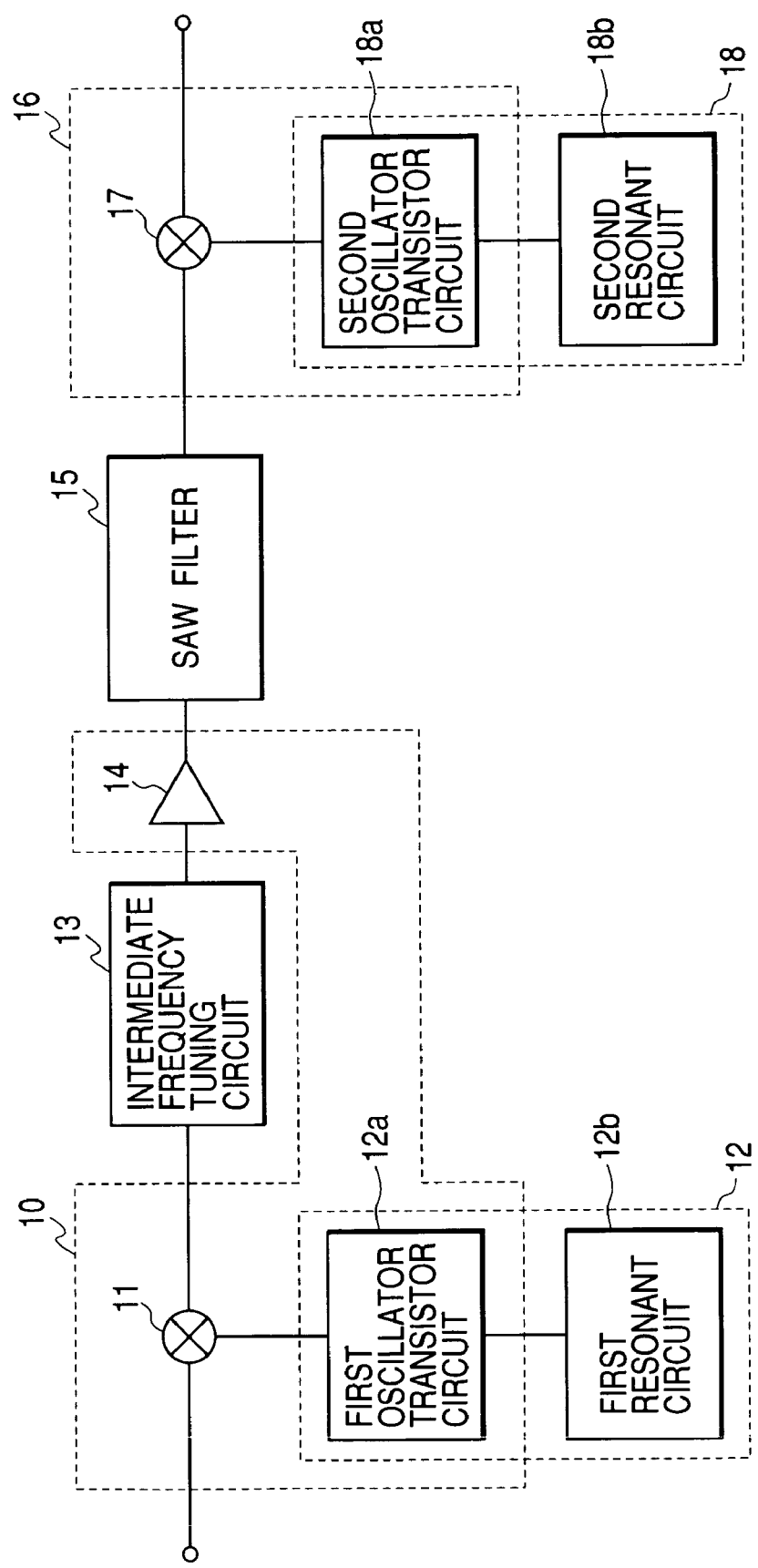
FIG. 2 is a circuit diagram illustrating the essential part of the television tuner according to the invention.
Figure 3:
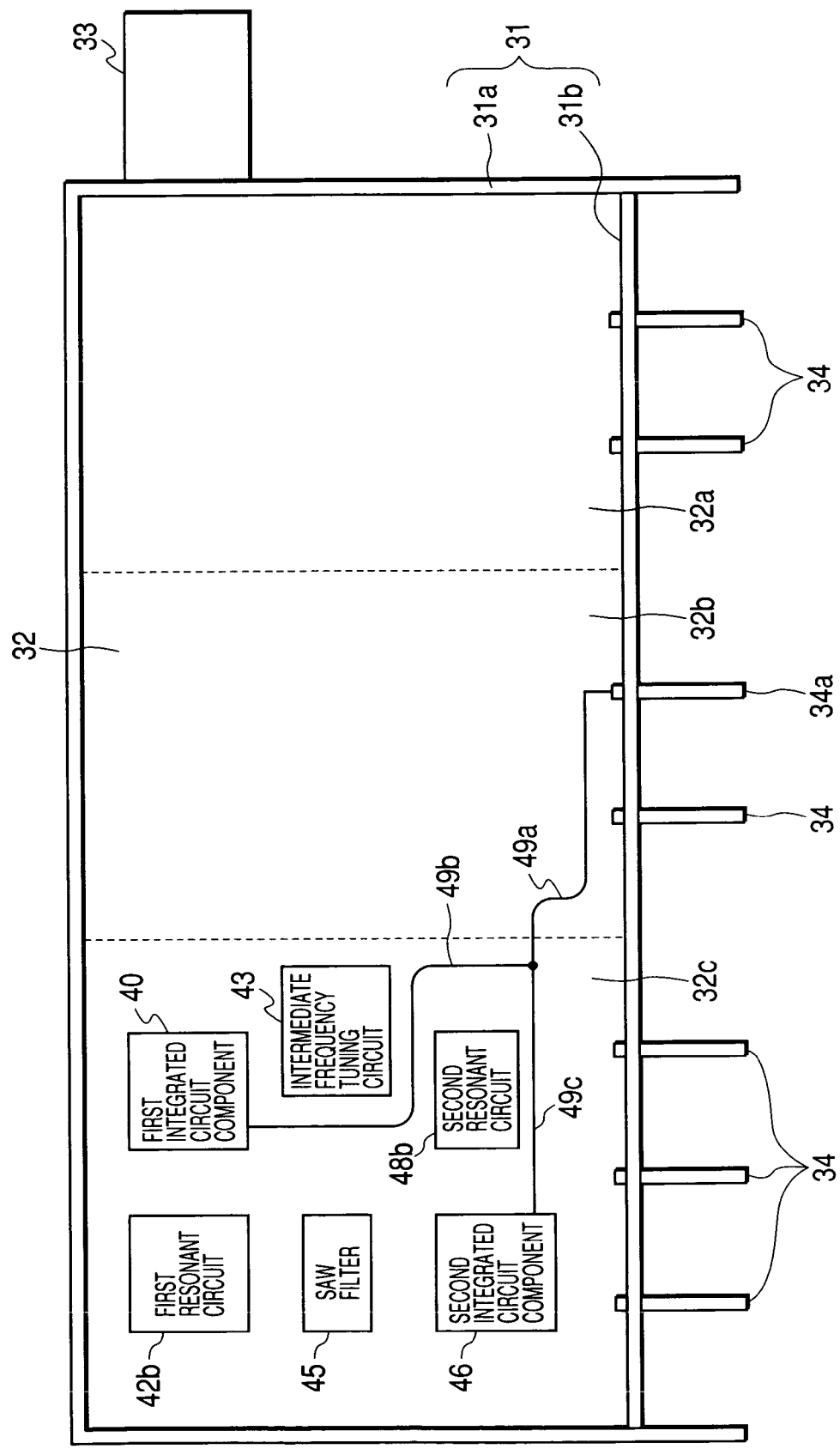
FIG. 3 is a layout diagram illustrating the traditional television tuner.
Figure 4:
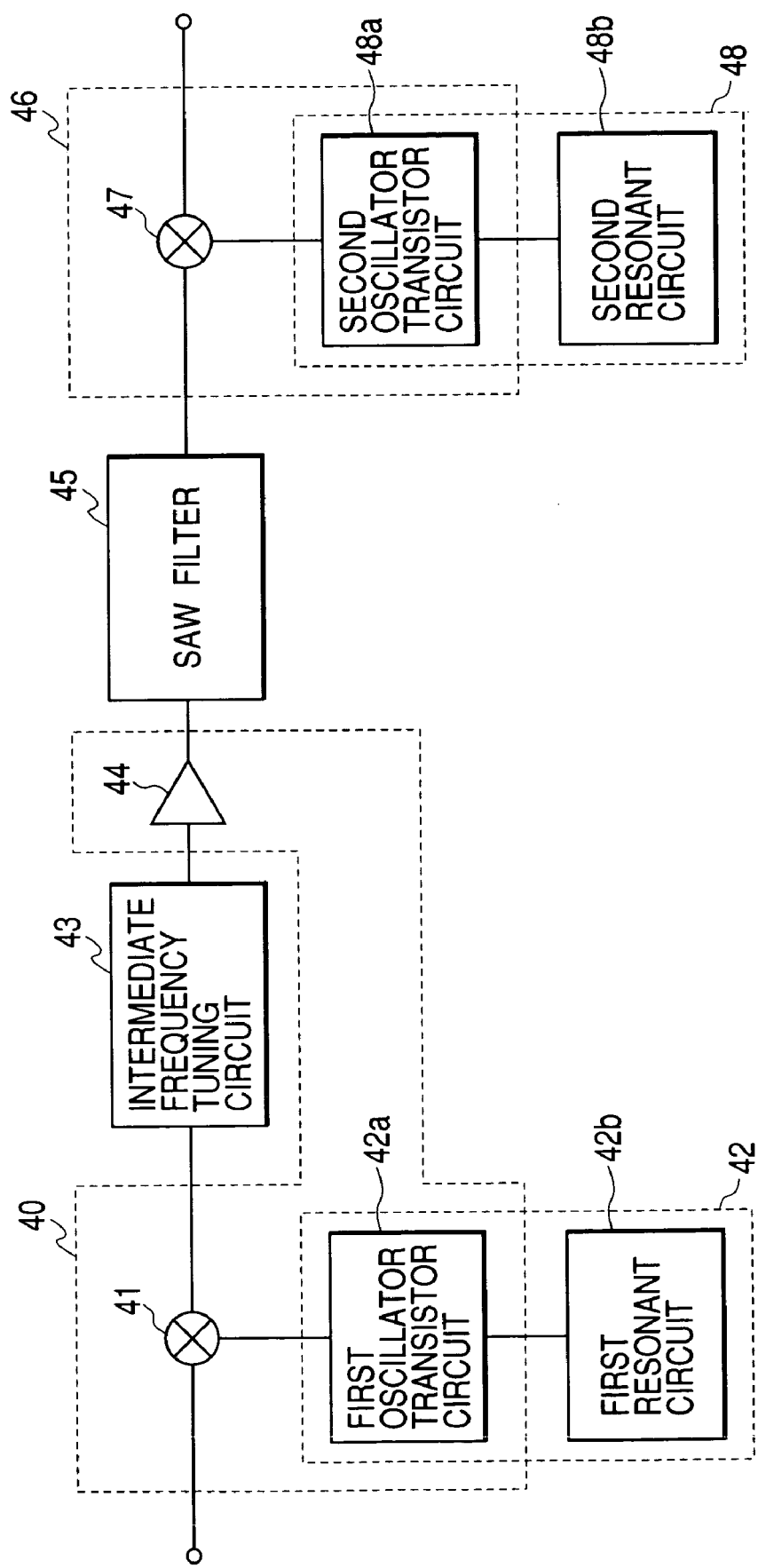
FIG. 4 is a circuit diagram illustrating the essential part of the traditional television tuner.

The intermediate frequency circuit has the configuration as shown in FIG. 2, and a first oscillation signal is fed from a first oscillator circuit 12 to a first mixer circuit 11 for converting frequencies. The first oscillator circuit 12 is formed of a first oscillator transistor circuit 12a and a first resonant circuit 12b coupled thereto. Then, the first mixer circuit 11 and the first oscillator transistor circuit 12a are formed in a first integrated circuit component 10. An intermediate frequency tuning circuit 13 is connected to the subsequent stage of the first mixer circuit 11, and an intermediate frequency amplifier circuit 14 is connected to the subsequent stage of the intermediate frequency tuning circuit 13. The intermediate frequency amplifier circuit 14 is also formed in the first integrated circuit component 10. A SAW filter 15 is connected to the subsequent stage of the intermediate frequency amplifier circuit 14.

A second mixer circuit 17 for synchronous detection is connected to the subsequent stage of the SAW filter 15. A second oscillation signal is fed to the second mixer circuit 17 from a second oscillator circuit 18. The second oscillator circuit 18 is formed of a second oscillator transistor circuit 18a and a second resonant circuit 18b coupled thereto. Among them, the second oscillator transistor circuit 18b is formed in a second integrated circuit component 16 along with the second mixer circuit 17.

And, when a television signal to be received is inputted to the first mixer circuit 11, it is mixed with the first oscillation signal outputted from the first oscillator circuit 12 and converted to an intermediate frequency signal. The intermediate frequency signal is inputted to the second mixer circuit 17 through the intermediate frequency tuning circuit 13, the intermediate frequency amplifier circuit 14 and the SAW filter 15. Then, it is mixed with a second oscillation signal (the same frequency as a video intermediate frequency in an intermediate frequency band) outputted from the second oscillator circuit 18 and is synchronously detected to obtain a video signal.

Next, the detailed layout of the intermediate frequency circuit formed in the third block area 2c will be described. The third block area 2c has a nearly square shape. And, the second integrated circuit component 16 is mounted close to the second side plate 1b in the third block area 2c, and the first integrated circuit component 10 is mounted at the position apart from the second side plate 1b more than the second integrated circuit component 16. Additionally, the second resonant circuit 18b is formed in the area between the second integrated circuit component 16 and the second side plate 1b. Consequently, the first integrated circuit component 10, the second integrated circuit component 16 and the second resonant circuit 18b are disposed so as to be in a row as the second integrated circuit component 16 is sandwiched.

Furthermore, the intermediate frequency tuning circuit 13 is formed on the second block area 2b side adjacent to the first integrated circuit component 10, the SAW filter 15 is mounted on the opposite side of the second block area 2b adjacent to the second integrated circuit component 16, and a first resonant circuit 12b is formed adjacent to the first integrated circuit component 10 at the position apart from the second block area 2b and the second side plate 1b more than the first integrated circuit component 10. Consequently, the intermediate frequency tuning circuit 13 and the SAW filter 15 are disposed on both sides as they sandwich the area formed with the first integrated circuit component 10, the second integrated circuit component 16 and the second resonant circuit 18b.

Moreover, a first power supply line 19b for feeding power source voltage to the first integrated circuit component 10 and a second power supply line 19c for feeding power source voltage to the second integrated circuit component 16 are led out of the area between the area mounted with the first integrated circuit component 10 and the area mounted with the second integrated circuit component 16. They extend in the direction of the second block area 2b nearly orthogonal to the direction of the line connecting the position to mount the first integrated circuit component 10 to the position to mount the second integrated circuit component 16, and they are connected to a common power supply line 19a in the second block area 2b. Then, the common power supply line 19a is connected to a terminal 3a to be applied with power source voltage in the second block area 2b.

Consequently, the intermediate frequency tuning circuit 13 and the second resonant circuit 18b sandwich the first power supply line 19b and the second power supply line 19c, and are placed on the both sides of them, thereby separating the second resonant circuit 18b from the power supply lines 19b and 19c. In addition, the second resonant circuit 18b is not surrounded by the two power supply lines 19b and 19c.

According to the configuration above, the position where the second resonant circuit 18b is formed is separated from the positions to mount the first integrated circuit component 10 having the first mixer circuit 11 formed therein and the intermediate frequency tuning circuit 13 as the second integrated circuit component 16 is sandwiched therebetween. Therefore, even when the harmonics are emitted from the second resonant circuit 18b forming the second oscillator circuit 18, they are hard to jump to the first mixer circuit 11 and the intermediate frequency tuning circuit 13. In addition, the position to mount the second resonant circuit 18b is separated from the two power supply lines 19b and 19c as well and is not surrounded by the two power supply lines 19b and 19c, thus further exerting advantages. Furthermore, the two power supply lines 19b and 19c are separately disposed in the third block area 2c without being connected to each other. Therefore, the coupling between the power supply lines decreases, and the harmonics jumped to the second power supply line 19c close to the second resonant circuit 18b are hard to jump to the first power supply line 19b. Consequently, a jump to the intermediate frequency tuning circuit 13 is reduced.

What is claimed is:

1. A television tuner comprising:

a first integrated circuit component formed with a first mixer circuit for converting a television signal to an intermediate frequency signal;

a second integrated circuit component formed with a second mixer circuit for synchronously detecting the intermediate frequency signal and an oscillator transistor circuit;

a resonant circuit coupled to the oscillator transistor circuit and forming an oscillator circuit for synchronous detection;

an intermediate frequency tuning circuit interposed between the first mixer circuit and the second mixer circuit; and a circuit board for mounting the first integrated circuit component, the second integrated circuit component, the intermediate frequency tuning circuit and the resonant circuit in a predetermined block area, wherein the resonant circuit is mounted on a side opposite to a side where the first integrated circuit component and the intermediate frequency tuning circuit are mounted as the second integrated circuit component is sandwiched bewteen, a power supply line that feeds power source voltage to the first integrated circuit component and the second integrated circuit component is disposed in the block area, and the power supply line is disposed between the first integrated circuit component and intermediate frequency tuning circuit and the second integrated circuit component, and the power supply line is formed of a first power supply line that feeds the power source voltage to the first integrated circuit component and a second power supply line for feeding the power source voltage to the second integrated circuit component, and the first power supply line and the second power supply line are formed separately in the block area without being connected to each other.

* * * * *